(12) United States Patent
Ren et al.

(10) Patent No.: US 10,192,993 B2
(45) Date of Patent: Jan. 29, 2019

(54) THIN FILM TRANSFER, MANUFACTURING METHOD THEREOF, ARRAY SUBSTRATE AND MANUFACTURING METHOD THEREOF

(71) Applicants: BOE TECHNOLOGY GROUP CO., LTD., Beijing (CN); ORDOS YUANSHENG OPTOELECTRONICS CO., LTD., Inner Mongolia (CN)

(72) Inventors: Yanwei Ren, Beijing (CN); Chaochao Sun, Beijing (CN); Kunpeng Zhang, Beijing (CN); Yezhou Fang, Beijing (CN); Jingyi Xu, Beijing (CN)

(73) Assignees: BOE TECHNOLOGY GROUP CO., LTD. (CN); ORDOS YUANSHENG OPTOELECTRONICS CO., LTD. (CN)

( * ) Notice: Subject to any disclaimer, the term of this patent is extended or adjusted under 35 U.S.C. 154(b) by 26 days.

(21) Appl. No.: 15/704,588

(22) Filed: Sep. 14, 2017

(65) Prior Publication Data

US 2018/0190830 A1 Jul. 5, 2018

(30) Foreign Application Priority Data

Jan. 3, 2017 (CN) .......................... 2017 1 0004017

(51) Int. Cl.
| | |
|---|---|
| *H01L 29/786* | (2006.01) |
| *H01L 27/12* | (2006.01) |
| *H01L 29/66* | (2006.01) |
| *G03F 7/30* | (2006.01) |
| *H01L 27/32* | (2006.01) |
| *G02F 1/1368* | (2006.01) |
| *G02F 1/1343* | (2006.01) |

(Continued)

(52) U.S. Cl.
CPC .... *H01L 29/78633* (2013.01); *H01L 27/1222* (2013.01); *H01L 27/1274* (2013.01); *H01L 27/1288* (2013.01); *H01L 29/66757* (2013.01); *H01L 29/78603* (2013.01); *H01L 29/78675* (2013.01); *G02F 1/1368* (2013.01); *G02F 1/134363* (2013.01); *G02F 2202/103* (2013.01); *G02F 2202/104* (2013.01); *G03F 7/16* (2013.01); *G03F 7/20* (2013.01); *G03F 7/30* (2013.01); *H01L 27/1251* (2013.01); *H01L 27/322* (2013.01); *H01L 27/3262* (2013.01); *H01L 27/3272* (2013.01)

(58) Field of Classification Search
None
See application file for complete search history.

(56) References Cited

U.S. PATENT DOCUMENTS

| | | | |
|---|---|---|---|
| 6,780,693 B2* | 8/2004 | Seo ...................... | H01L 21/2022 438/166 |
| 8,405,161 B2* | 3/2013 | Park ...................... | H01L 27/1214 257/401 |
| 2005/0073060 A1* | 4/2005 | Datta ...................... | G11C 11/412 257/296 |

* cited by examiner

*Primary Examiner* — Dung Le
(74) *Attorney, Agent, or Firm* — Brooks Kushman P.C.

(57) ABSTRACT

The present disclosure provides a TFT, a manufacturing method thereof, an array substrate and a manufacturing method thereof. The TFT includes a substrate, a p-Si active layer arranged on the substrate, and a first a-Si layer arranged on a surface of the p-Si active layer at a side adjacent to the substrate. An orthogonal projection of the p-Si active layer onto the substrate at least partially overlaps an orthogonal projection of the first a-Si layer onto the substrate.

18 Claims, 6 Drawing Sheets

(51) Int. Cl.
*G03F 7/16* (2006.01)
*G03F 7/20* (2006.01)

THIN FILM TRANSFER, MANUFACTURING METHOD THEREOF, ARRAY SUBSTRATE AND MANUFACTURING METHOD THEREOF

CROSS-REFERENCE TO RELATED APPLICATION

The present application claims priority to Chinese Patent Application No. 201710004017.8 filed on Jan. 3, 2017, which is incorporated herein by reference in its entirety.

TECHNICAL FIELD

The present disclosure relates to the field of display technology, in particular to a thin film transistor (TFT), a manufacturing method thereof, an array substrate and a manufacturing method thereof.

BACKGROUND

Due to its advantages such as high resolution, rapid response, high brightness and high aperture ratio as well as a characteristic of Low Temperature Poly-Silicon (LTPS), a LTPS-TFT display device has high electron mobility.

During the manufacture of an LTPS-TFT, usually an amorphous silicon (a-Si) thin film is subjected to crystallization, to form a poly-silicon (p-Si) thin film.

However, for the p-Si thin film formed as mentioned above, sizes of its grains may vary along with laser energy sizes, i.e., the p-Si thin film may include the grains in different sizes. At this time, the performance of the TFT may be adversely affected.

SUMMARY

In one aspect, the present disclosure provides in some embodiments a TFT, including a substrate, a p-Si active layer arranged on the substrate, and a first a-Si layer arranged on a surface of the p-Si active layer at a side adjacent to the substrate. An orthogonal projection of the p-Si active layer onto the substrate at least partially overlaps an orthogonal projection of the first a-Si layer onto the substrate.

In a possible embodiment of the present disclosure, the first a-Si layer has a thickness within the range of 500 to 2000 Å, and the p-Si active layer has a thickness within the range of 500 to 2000 Å.

In a possible embodiment of the present disclosure, the TFT further includes a buffer layer arranged on a surface of the base substrate at a side adjacent to the first a-Si layer, a groove is formed in the buffer layer, and the first a-Si layer is arranged in the groove.

In a possible embodiment of the present disclosure, the TFT further includes a gate insulation layer, a gate electrode, an inter-layer insulation layer, a source electrode and a drain electrode arranged sequentially on the p-Si active layer away from the substrate, and the source electrode and the drain electrode are in contact with the p-Si active layer through via-holes in the inter-layer insulation layer and the gate insulation layer.

In a possible embodiment of the present disclosure, the gate insulation layer is made of a material identical to the inter-layer insulation layer.

In a possible embodiment of the present disclosure, the orthogonal projection of the p-Si active layer onto the substrate completely overlaps the orthogonal projection of the first a-Si layer onto the substrate.

In another aspect, the present disclosure provides in some embodiments an array substrate including the above-mentioned TFT.

In a possible embodiment of the present disclosure, the array substrate further includes a pixel electrode electrically connected to a drain electrode of the TFT.

In a possible embodiment of the present disclosure, the array substrate further includes a common electrode arranged at a layer identical to, and spaced apart from, the pixel electrode, and each of the pixel electrode and the common electrode is a strip-like electrode.

In a possible embodiment of the present disclosure, the array substrate further includes a common electrode arranged at a layer different from the pixel electrode, an upper one of the pixel electrode and the common electrode is a strip-like electrode, and a lower one of the pixel electrode and the common electrode is a plate-like electrode.

In a possible embodiment of the present disclosure, the array substrate further includes a color filter layer.

In yet another aspect, the present disclosure provides in some embodiments a method for manufacturing a TFT, including a step of forming a p-Si active layer on a substrate through crystallization. Prior to the step of forming the p-Si active layer, the method further includes forming a first a-Si layer in contact with the p-Si active layer. An orthogonal projection of the p-Si active layer onto the substrate at least partially overlaps an orthogonal projection of the first a-Si layer onto the substrate.

In a possible embodiment of the present disclosure, the method further includes forming a buffer layer on a surface of the substrate at a side adjacent to the first a-Si layer. The step of forming the buffer layer and the first a-Si layer includes: forming a buffer layer film on the substrate and forming a first photoresist layer on the buffer layer film; exposing and developing the first photoresist layer with a first mask plate to expose a portion of the buffer layer film corresponding the p-Si active layer; etching the buffer layer film through an etching process, to form the buffer layer with a groove; removing the remaining portion of the first photoresist layer; forming a first a-Si film on the buffer layer and forming a second photoresist layer on the first a-Si film; exposing and developing the second photoresist layer with a second mask plate, to maintain a portion of the second photoresist layer above the groove; etching the first a-Si film and the buffer layer through an etching process, until an upper surface of the first a-Si layer in the groove is flush with a surface of the buffer layer at a position other than a position where the groove is formed; and removing the remaining portion of the second photoresist layer.

In a possible embodiment of the present disclosure, the first mask plate is identical to the second mask plate, and the first photoresist layer is made of a positive photoresist and the second photoresist layer is made of a negative photoresist, or the first photoresist layer is made of a negative photoresist and the second photoresist layer is made of a positive photoresist.

In a possible embodiment of the present disclosure, the step of forming the p-Si active layer includes: forming a second a-Si film on the substrate with the first a-Si layer; subjecting the second a-Si film to crystallization, to form a p-Si film; forming a third photoresist layer on the p-Si film, and exposing and developing the third photoresist layer with the second mask plate; etching the p-Si film through an etching process to form the p-Si active layer; and removing the remaining portion of the third photoresist layer.

In a possible embodiment of the present disclosure, the step of forming the p-Si active layer includes: forming a second a-Si film on the substrate with the first a-Si layer; forming a third photoresist layer on the second a-Si film; exposing and developing the third photoresist layer with the second mask plate; etching the second a-Si film through an etching process to form a second a-Si layer; removing the remaining portion of the third photoresist layer; and subjecting the second a-Si layer to crystallization, to form the p-Si active layer.

In a possible embodiment of the present disclosure, the etching process is a dry-etching process.

In a possible embodiment of the present disclosure, the first a-Si layer has a thickness within the range of 500 to 2000 Å, and the p-Si active layer has a thickness within the range of 500 to 2000 Å.

In a possible embodiment of the present disclosure, the orthogonal projection of the p-Si active layer onto the substrate completely overlaps the orthogonal projection of the first a-Si layer onto the substrate.

In still yet another aspect, the present disclosure provides in some embodiments a method for manufacturing an array substrate, including the above-mentioned method for manufacturing the TFT.

BRIEF DESCRIPTION OF THE DRAWINGS

In order to illustrate the technical solutions of the present disclosure or the related art in a clearer manner, the drawings desired for the present disclosure or the related art will be described hereinafter briefly. Obviously, the following drawings merely relate to some embodiments of the present disclosure, and based on these drawings, a person skilled in the art may obtain the other drawings without any creative effort.

DETAILED DESCRIPTION

In order to make the objects, the technical solutions and the advantages of the present disclosure more apparent, the present disclosure will be described hereinafter in a clear and complete manner in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "connect" or "connected to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

Figure 1:
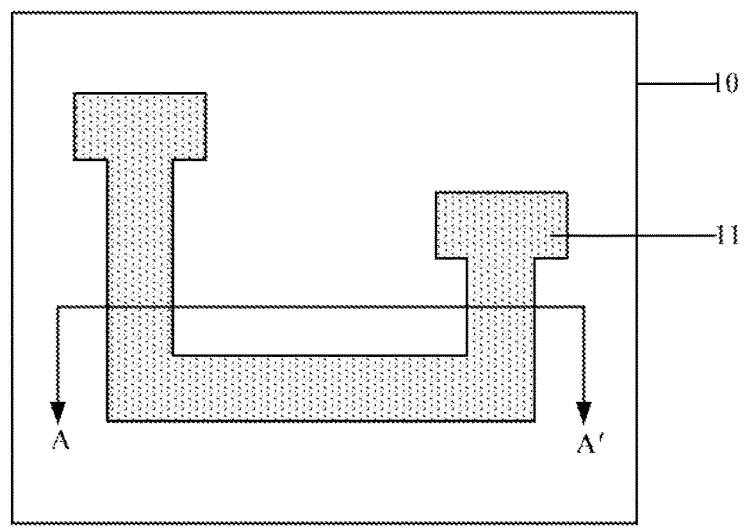
FIG. 1 is a top view of a p-Si active layer on a substrate according to one embodiment of the present disclosure.
Figure 2:
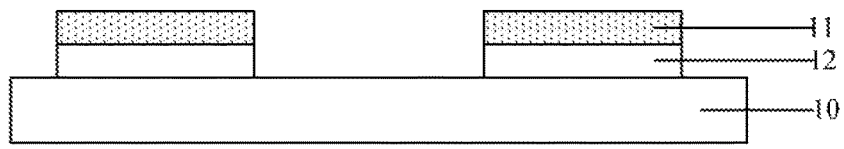
FIG. 2 is a sectional view of the p-Si active layer along line AA' in FIG. 1.

The present disclosure provides in some embodiments a TFT which, as shown in FIGS. 1 and 2, includes a substrate 10, a p-Si active layer 11 arranged on the substrate 10, and a first a-Si layer 12 arranged at a surface of the p-Si active layer 11 at a side adjacent to the substrate 10. An orthogonal projection of the p-Si active layer 11 onto the substrate 10 at least partially overlaps an orthogonal projection of the first a-Si layer 12 onto the substrate 10.

It should be appreciated that, firstly, the p-Si active layer 11 may be acquired by subjecting an a-Si layer or film to crystallization. In other words, after the formation of the first a-Si layer 12, a second a-Si layer or film may be formed on the first a-Si layer 12 and then subjected to crystallization to form the p-Si active layer 11.

Secondly, a size of the first a-Si layer 12 will not be particularly defined herein. The first a-Si layer 12 may have a size identical to, smaller than or greater than the p-Si active layer 11.

Thirdly, it should be appreciated that, the TFT may further include some other components such as a gate electrode, a source electrode and a drain electrode, and the source electrode and the drain electrode may be in contact with the p-Si active layer 11.

According to the TFT in the embodiments of the present disclosure, the first a-Si layer 12 is formed prior to the formation of the p-Si active layer 11 of the TFT, and it may serve as a shielding layer to prevent the p-Si active layer 11 from being adversely affected by light. In addition, the p-Si active layer 11 is acquired by subjecting the second a-Si layer or film on the first a-Si layer 12 to crystallization, so during the crystallization, it is able to control the second a-Si layer or film to be in a completely fused state, and control a portion of the first a-Si layer adjacent to the second a-Si layer or film to be in a partially fused state. There exist a large number of seed crystals in the first a-Si layer 12, so there may also exist a large number of seed crystals in the portion of the first a-Si layer 12 in the partially fused state. In the case that the second a-Si layer or film is converted into the p-Si layer or film, grains may grow in a lateral direction along the seed crystals. As a result, it is able to provide the p-Si active layer 11 with large grains and excellent crystallization uniformity, thereby to increase the mobility of the TFT and reduce the power consumption of the TFT.

In some possible embodiments of the present disclosure, in order to simplify the manufacture process, the p-Si active layer 11 may have a shape and a size identical to the first a-Si layer 12, and the orthogonal projection of the p-Si active layer 11 onto the substrate 10 may completely overlap the orthogonal projection of the first a-Si layer 12 onto the substrate 10.

In some possible embodiments of the present disclosure, the first a-Si layer 12 may have a thickness within the range of 500 to 2000 Å, and the p-Si active layer 11 may have a thickness within the range of 500 to 2000 Å.

In the embodiments of the present disclosure, the thickness of the p-Si active layer 11, i.e., the second a-Si layer or film, may be within the range of 500 to 2000 Å. In this regard, during the conversion of the second a-Si layer or film into a p-Si layer or film, it is able to reduce the power consumption due to the large thickness of the second a-Si layer or film, thereby to simplify the manufacture process and remarkably reduce the manufacture cost. In other words, in the case that the second a-Si layer or film has a thickness within the range of 500 to 2000 Å, it is able to acquire the p-Si layer by subjecting the second a-Si layer or film to crystallization using an existing device, thereby to reduce the manufacture cost.

Based on the above, in the case that the first a-Si layer 12 has a thickness within the range of 500 to 2000 Å, it is able to, on one hand, fuse a part of the first a-Si layer 12 during the crystallization and ensure the acquisition of the large grains as well as the crystallization uniformity, and on the other hand, prevent the waste of materials and reduce the manufacture cost.

Figure 3:
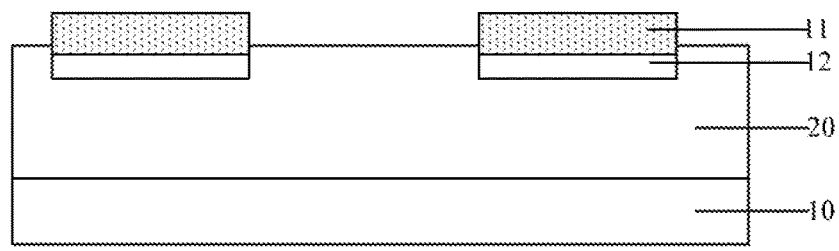
FIG. 3 is another sectional view of the p-Si active layer along line AA' in FIG. 1.

In some embodiments of the present disclosure, as shown in FIG. 3, the TFT further includes a buffer layer 20 arranged at a surface of the substrate 10 at a side adjacent to the first a-Si layer 12. A groove is formed in the buffer layer 20, and the first a-Si layer 12 is arranged in the groove.

Through the buffer layer 20, it is able to prevent the performance of the p-Si active layer 11 from being adversely affected by hazardous substances in the substrate 10, e.g., alkali metal ions. In addition, through forming the first a-Si layer 12 in the groove in the buffer layer 20, it is able to reduce a thickness of the entire TFT.

Figure 4:
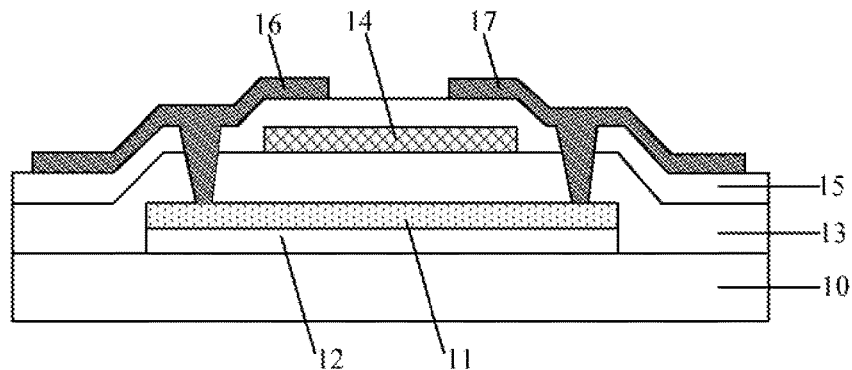
FIG. 4 is a schematic view of a TFT according to one embodiment of the present disclosure.
Figure 5:
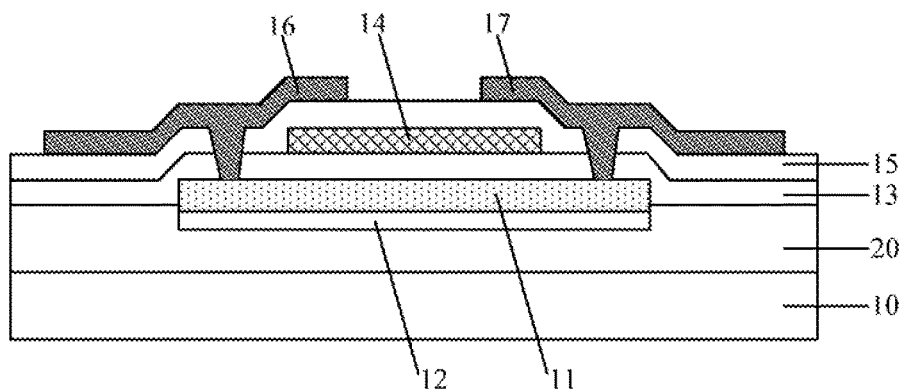
FIG. 5 is another schematic view showing the TFT according to one embodiment of the present disclosure.

As shown in FIGS. 4 and 5, the TFT further includes a gate insulation layer 13, a gate electrode 14, an inter-layer insulation layer 15, a source electrode 16 and a drain electrode 17 arranged sequentially on the p-Si active layer away from the substrate 10. The source electrode 16 and the drain electrode 17 are in contact with the p-Si active layer 11 through via-holes in the inter-layer insulation layer 15 and the gate insulation layer 13. The gate insulation layer 13 may be made of a material identical to, or different from, the inter-layer insulation layer 15, as long as the adjacent layers may be insulated from each other by each of them. The gate electrode 14, the source electrode 16 and the drain electrode 17 may be made of an identical material or different materials.

Figure 6:
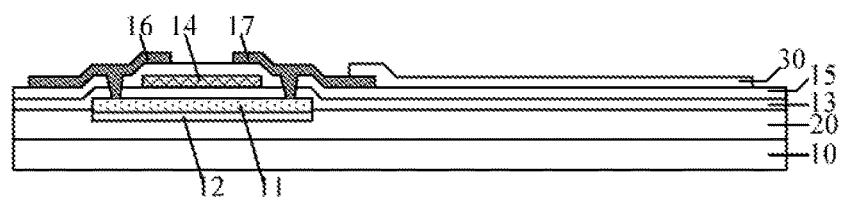
FIG. 6 is a schematic view showing an array substrate according to one embodiment of the present disclosure.

The present disclosure further provides in some embodiments an array substrate including the above-mentioned TFT. To be specific, the array substrate may be applied to a Liquid Crystal Display (LCD). In this case, as shown in FIG. 6, the array substrate may further include a pixel electrode 30 electrically connected to the drain electrode 17.

Figure 10:
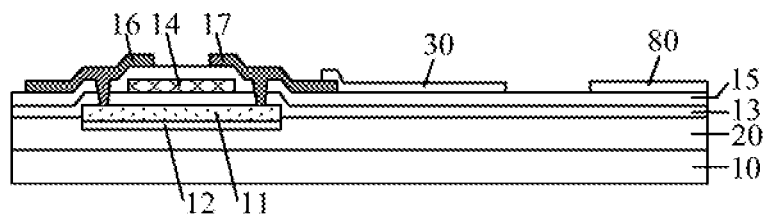
FIG. 10 is a schematic view showing an array substrate according to one embodiment of the present disclosure.
Figure 11:
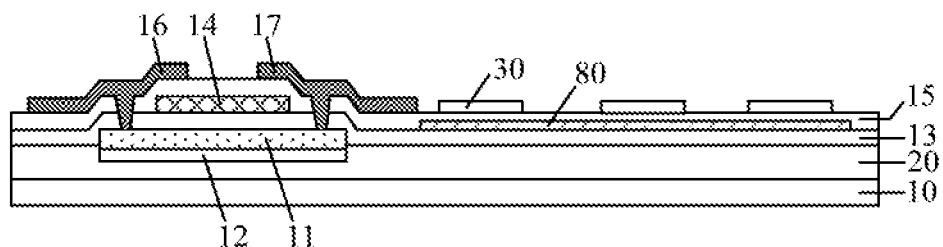
FIG. 11 is a schematic view showing an array substrate according to another embodiment of the present disclosure.

The array substrate may further include a common electrode. For an in-Plane Switch (IPS) array substrate, the pixel electrode 30 may be arranged at a. layer identical to, and spaced apart from, the common electrode 80, and both the pixel electrode 30 and the common electrode 80 may be strip-like electrodes, as illustrated in FIG. 10. For an Advanced Super Dimensional Switching (ADS) array substrate, the pixel electrode 30 may be arranged at a layer different from the common electrode 80, an upper one of them may be a strip-like electrode, and a lower one of them may be a plate-like electrode, as illustrated in FIG. 11.

The array substrate may further include a color filter layer.

Figure 7:
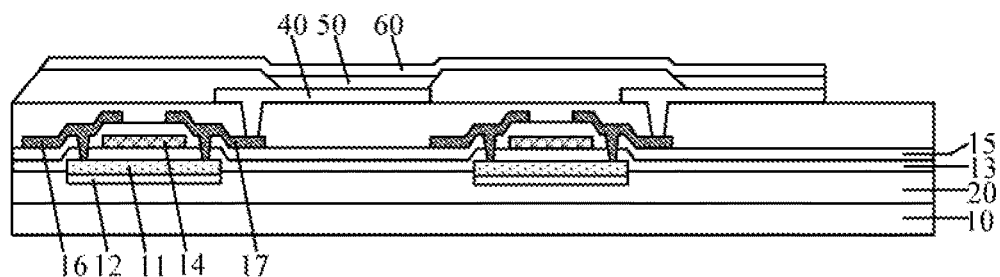
FIG. 7 is another schematic view showing the array substrate according to one embodiment of the present disclosure.
Figure 8A:
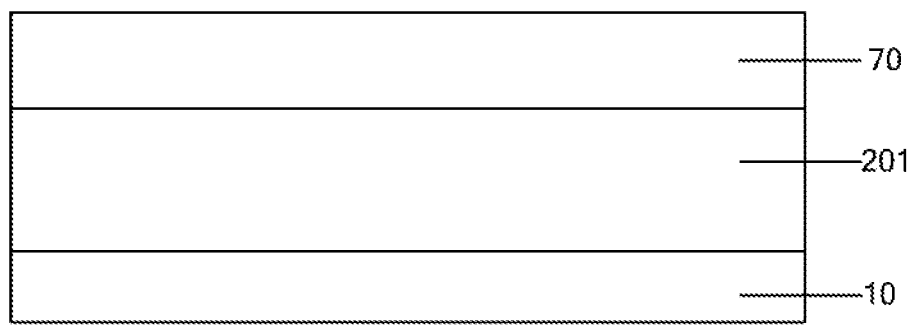
FIGS. 8(a) to 8(g) are schematic views showing the formation of a buffer layer and a first a-Si layer according to one embodiment of the present disclosure.
Figure 8B:
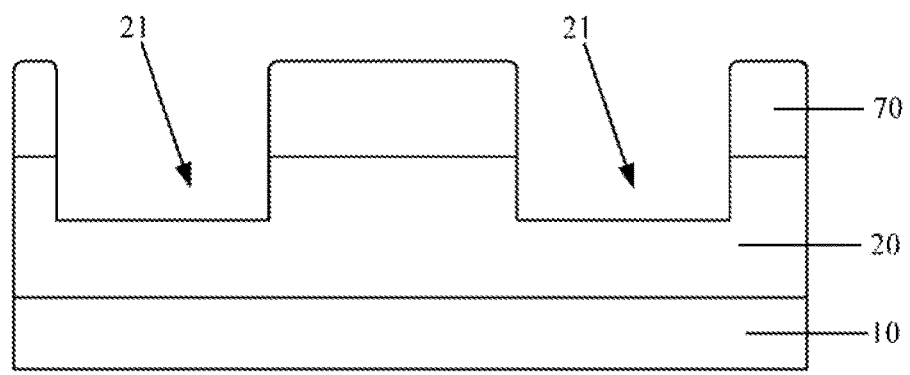
Figure 8C:
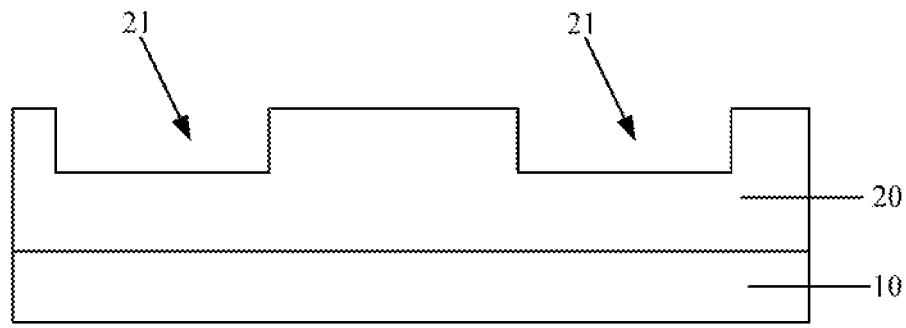
Figure 8D:
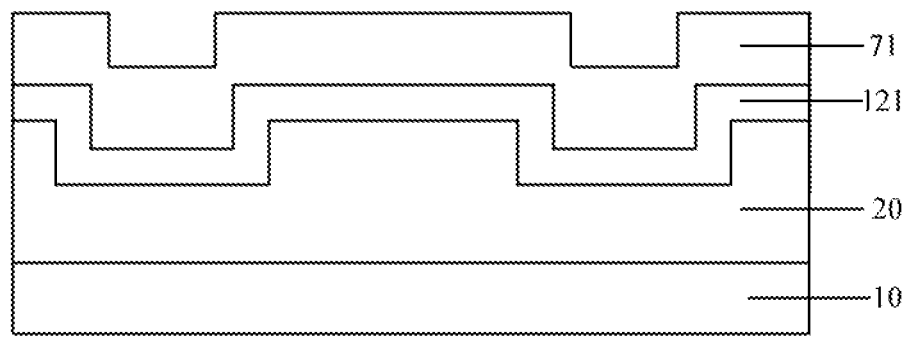
Figure 8E:
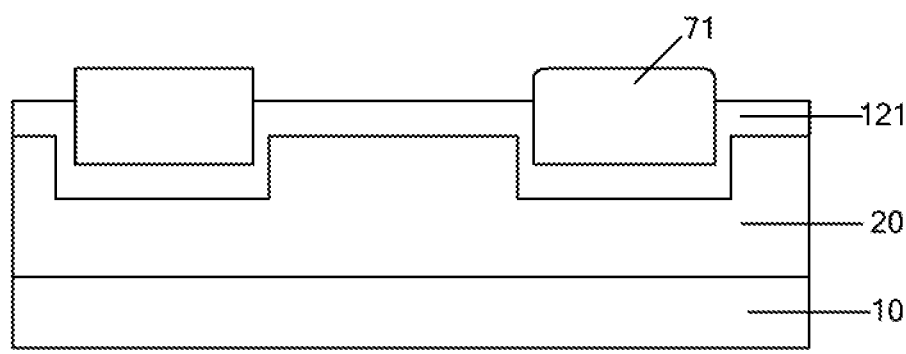
Figure 8F:
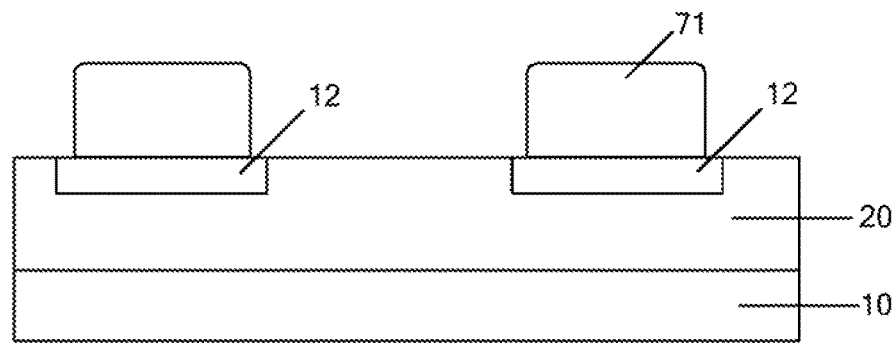
Figure 8G:
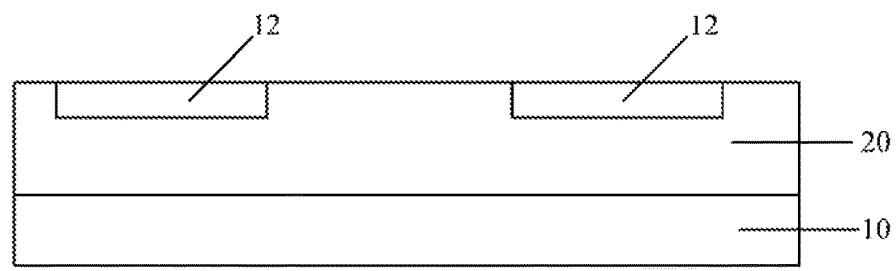

The array substrate may also be applied to an Organic Light-Emitting Diode (OLED) display. In this case, as shown in FIG. 7, the array substrate may further include an anode 40 electrically connected to the drain electrode 17, and an organic material function layer 50 and a cathode 60 arranged above the anode 40.

The organic material function layer 50 may at least include a light-emitting layer. In order to improve the efficiency of the injection of electrons and holes into the light-emitting layer, the organic material function layer 50 may further include an electron transport layer, a hole transport layer, an electron injection layer arranged between the cathode 60 and the electron transport layer, and a hole injection layer arranged between the hole transport layer and the anode 40.

Depending on different materials of the anode 40 and the cathode 60, in the case that the array substrate is applied to a display device, the display device may be a single-surface emission display device or a double-surface emission display device. In other words, in the case that one of the anode 40 and the cathode 60 is nontransparent, the display device is a single-surface emission display device, and in the case that the anode 40 and the cathode 60 are both transparent, the display device is a double-surface emission display device.

For the single-surface emission display device, depending on the materials of the anode 40 and the cathode 60, it may be a top-emission display device or a bottom-emission display device. To be specific, in the case that the transparent anode 40 is arranged adjacent to the substrate 10 and the nontransparent cathode 60 is arranged away from the substrate 10, the display device is a bottom-emission display device, and in the case that the anode 40 is nontransparent and the cathode 60 is transparent, the display device is a top-emission display device.

According to the array substrate in the embodiments of the present disclosure, the first a-Si layer 12 is formed prior to the formation of the p-Si active layer 11 of the TFT, and it may serve as a shielding layer to prevent the p-Si active layer 11 from being adversely affected by light. In addition, the p-Si active layer 11 is acquired by subjecting the second a-Si layer or film above the first a-Si layer 12 to crystallization, so during the crystallization, it is able to control the second a-Si layer or film to be in a completely fused state, and control a portion of the first a-Si layer 12 adjacent to the second a-Si layer or film to be in a partially fused state. There exist a large number of seed crystals in the first a-Si layer 12, so there may also exist a large number of seed crystals in the portion of the first a-Si layer 12 in the partially fused state. In the case that the second a-Si layer or film is converted into the p-Si layer or film, grains may grow in a lateral direction along the seed crystals. As a result, it is able to provide the p-Si active layer 11 with large grains and excellent crystallization uniformity, thereby to increase the mobility of the TFT and reduce the power consumption of the TFT, and apply the TFT to a circuit of a high-end display product (e.g., an AMOLED display device) with high resolution and low power consumption.

The present disclosure further provides in some embodiments a method for manufacturing the TFT. As shown in FIGS. 1 and 2, the method may include a step of forming the p-Si active layer 11 on the substrate 10 through crystallization. Prior to the step of forming the p-Si active layer 11, the method further includes forming the first a-Si layer 12 in contact with the p-Si active layer 11. An orthogonal projection of the p-Si active layer 11 onto the substrate 10 at least partially overlaps an orthogonal projection of the first a-Si layer 12 onto the substrate 10.

It should be appreciated that, the p-Si active layer 11 is acquired by subjecting an a-Si layer or film to crystallization. In other words, after the formation of the first a-Si layer 12, a second a-Si layer may be formed on the first a-Si layer 12 and then subjected to crystallization to acquire the p-Si active layer 11. In a possible embodiment of the present disclosure, after the formation of the first a-Si layer 12, a second a-Si film may be formed on the first a-Si layer 12, subjected to crystallization and then patterned to acquire the p-Si active layer 11.

A process for the crystallization will not be particularly defined herein. For example, a laser annealing process, a high-temperature crystallization process, or a metal-induced crystallization process may be adopted.

According to the method for manufacturing the TFT in the embodiments of the present disclosure, the first a-Si layer 12 is formed prior to the formation of the p-Si active layer 11 of the TFT, and it may serve as a shielding layer to prevent the p-Si active layer 11 from being adversely affected by light. In addition, the p-Si active layer 11 is acquired by subjecting the second a-Si layer or film above the first a-Si layer 12 to crystallization, so during the crystallization, it is able to control the second a-Si layer or film to be in a completely fused state, and control a portion of the first a-Si layer adjacent to the second a-Si layer or film to be in a partially fused state. There exist a large number of seed crystals in the first a-Si layer 12, so there may also exist a large number of seed crystals in the portion of the first a-Si layer 12 in the partially fused state. In the case that the second a-Si layer or film is converted into the p-Si layer or film, grains may grow in a lateral direction along the seed crystals. As a result, it is able to provide the p-Si active layer 11 with large grains and excellent crystallization uniformity, thereby to increase the mobility of the TFT and reduce the power consumption of the TFT.

In some possible embodiments of the present disclosure, in order to simplify the manufacture process, the p-Si active layer 11 may have a shape and a size identical to the first a-Si layer 12, and the orthogonal projection of the p-Si active layer 11 onto the substrate 10 may completely overlap the orthogonal projection of the first a-Si layer 12 onto the substrate 10.

In some embodiments of the present disclosure, as shown in FIG. 3, the method may further include forming the buffer layer 20 at a surface of the substrate 10 at a side adjacent to the first a-Si layer 12.

Based on the above, the step of forming the buffer layer 20 and the first a-Si layer 12 may include the following steps.

Step S101: as shown in FIG. 8(*a*), a buffer layer film 201 may be formed on the substrate 10, and a first photoresist layer 70 may be formed on the buffer layer film 201.

Here, the buffer layer film 201 may be of a single-layered or multi-layered structure, and it may be made of, e.g., silicon nitride (SiN) or silicon oxide (SiOx). The buffer layer film 201 may be deposited onto the substrate 101 through Plasma Enhanced Chemical Vapor Deposition (PECVD). The first photoresist layer 70 may be made of a positive or negative photoresist.

Step S102: as shown in FIG. 8(*b*), the first photoresist layer 70 may be exposed and developed using a first mask plate, to expose a region of the buffer layer film 201 corresponding to the p-Si active layer 11.

Here, the first mask plate includes a fully-transparent portion and nontransparent portion. In the case that the first photoresist layer 70 is made of a positive photoresist, the fully-transparent portion of the first mask plate corresponds to the region where the p-Si active layer 11 is located, and in the case that the first photoresist layer 70 is made of a negative photoresist, the nontransparent portion of the first mask plate corresponds to the region where the p-Si active layer 11 is located.

Step S103: as shown in FIGS. 8(*b*) and 8(*c*), the buffer layer film 201 may be etched through an etching process to form the buffer layer with the groove 21, and then the remaining first photoresist layer 70 may be removed.

In this step, as compared with a wet-etching process, it is able for a dry-etching process to control a side wall of the groove 21 in such a manner that the side wall is substantially perpendicular to the substrate 10, so the buffer layer film 201 not covered by the remaining first photoresist layer 70 acquired after Step S102 may be preferably etched through a dry-etching process.

Step S104: as shown in FIGS. 8(*d*) and 8(*e*), a first a-Si film 121 may be formed on the buffer layer 20, and a second photoresist layer 71 may be formed on the first a-Si film 121 and then exposed and developed, to reserve a portion of the second photoresist layer 71 above the groove 21.

In this step, the first a-Si film 121 may be deposited onto the buffer layer 20 through PECVD. The second photoresist layer 71 may be made of a positive or negative photoresist. The second mask plate may include a fully-transparent portion and a nontransparent portion. In the case that the second photoresist layer 71 is made of a positive photoresist, the nontransparent portion of the second mask plate corresponds to the groove 21, and in the case that the second photoresist layer 71 is made of a negative photoresist, the fully-transparent portion of the second mask plate corresponds to the groove 21.

It should be appreciated that, the side wall of the groove 21 is substantially perpendicular to the substrate 10, so in the case of forming the first a-Si film 121 on the buffer layer 20, a portion of the first a-Si film 121 on the side wall of the groove 21 may be omitted.

Step S105: as shown in FIG. 8(*f*), the first a-Si film 121 and the buffer layer 20 may be etched through an etching process, until an upper surface of the first a-Si layer 12 in the groove 21 is in flush with a surface of the buffer layer 20 at a position other than a position where the groove is formed.

Here, it is able to control the formed pattern in a better manner when using a dry-etching process, so preferably the first a-Si film 121 and the buffer layer 20 not covered by the remaining second photoresist layer 71 acquired after Step S104 may be etched through a dry-etching process, to ensure the upper surface of the first a-Si layer 12 in the groove 21 to be in flush with the surface of the buffer layer 20 at the position other than the position where the groove is formed. In other words, the first a-Si layer 12 may be embedded into the groove 21, and the upper surface of the first a-Si layer 12 may be located within a plane identical to the upper surface of the buffer layer 20.

Step S106: as shown in FIG. 8(*g*), the remaining second photoresist layer 71 may be removed.

On one hand, through the buffer layer 20, it is able to prevent the performance of the p-Si active layer 11 from being adversely affected by hazardous substances in the substrate 10, e.g., alkali metal ions. On the other hand, in the case that the upper surface of the first a-Si layer 12 is in flush with the surface of the buffer layer 20 at the position other than the position where the groove 21 is formed, it is able to provide a flatter second a-Si film during the subsequent formation of the p-Si active layer 11, thereby to improve the performance of the p-Si active layer 11. In addition, through the formation of the first a-Si layer 12 in the groove in the buffer layer 20, it is able to reduce the thickness of the TFT.

The region exposed after the development in Step S102 and the region exposed after the development in Step S104 may complement each other. In order to simplify the manufacture process and reduce the manufacture cost, in a possible embodiment of the present disclosure, the first mask plate may be identical to the second mask plate. Based on this, the first photoresist layer 70 may be made of a positive photoresist and the second photoresist layer 71 may be made of a negative photoresist, or the first photoresist layer 70 may be made of a negative photoresist and the second photoresist layer 71 may be made of a positive photoresist.

In some possible embodiments of the present disclosure, based on the above Steps S101 to S106, the step of forming the p-Si active layer 11 may include the following steps.

Figure 9A:
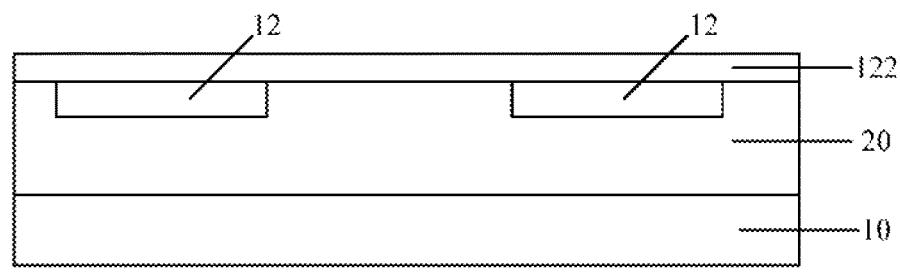
FIGS. 9(a) and 9(h) are schematic views showing the formation of the p-Si active layer according to one embodiment of the present disclosure.

Step S201: as shown in FIG. 9(a), a second a-Si film 122 may be formed on the substrate 10 with the first a-Si layer 12.

Figure 9B:
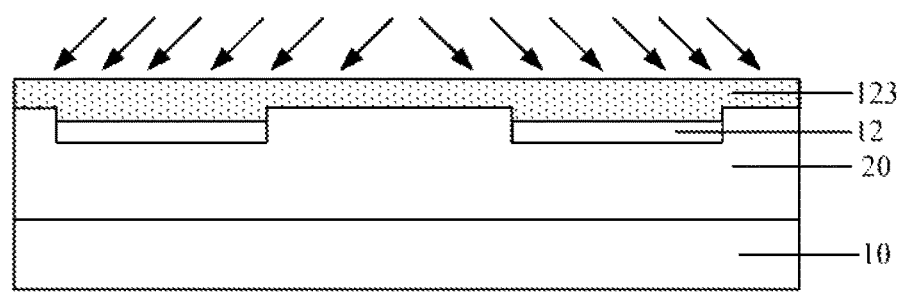

Step S202: as shown in FIG. 9(b), the second a-Si film 122 may be subjected to crystallization, to form a p-Si film 123.

In Steps S201 and S202, the second a-Si film 122 may be deposited onto the substrate 10 through PECVD, and then subjected to dehydrogenation through a high-temperature oven, to prevent the occurrence of hydrogen explosion during the crystallization and reduce the occurrence of a defect density of state inside the crystallized film. After the dehydrogenation, the second a-Si film 122 may be subjected to crystallization through an excimer laser annealing (ELA) process, a metal-induced crystallization (MIC) process or a solid phase crystallization (SPC) process, to form the p-Si film 123.

It should be appreciated that, as shown in FIG. 9(b), in the case that the second a-Si film 122 is subjected to crystallization, a portion of the first a-Si layer 12 adjacent to the second a-Si film 122 may be in a partially fused state. After the crystallization, the portion of the first a-Si layer 12 adjacent to the second a-Si film 122 may be converted to a portion of the p-Si active layer 11.

Step S203: a third photoresist layer may be formed on the p-Si film 123, and then exposed and developed through the second mask plate. In other words, the third photoresist layer may be exposed through the mask plate identical to that in Step S104. The third photoresist layer may be made of a material identical to the second photoresist layer 71.

Step S204: the p-Si film 123 may be etched through an etching process to form the p-Si active layer 11 as shown in FIG. 3, and then the remaining third photoresist layer may be removed.

Here, in a possible embodiment of the present disclosure, the p-Si film 123 not covered by the remaining third photoresist layer acquired after Step S203 may be etched through a dry-etching process.

Of course, based on Steps S101 to S106, the p-Si active layer 11 may be formed in the following ways. The second a-Si film 122 may be formed on the substrate with the first a-Si layer 12, and then the third photoresist layer may be formed on the second a-Si film 122. Next, the third photoresist layer may be exposed and developed through the second mask plate. An exposed portion of the second a-Si film 122 may be etched through an etching process to form the second a-Si layer, and the remaining third photoresist layer may be removed. Finally, the second a-Si layer may be subjected to crystallization to form the p-Si active layer 11.

In some embodiments of the present disclosure, the first a-Si layer 12 may have a thickness within the range of 500 to 2000 Å, and the p-Si active layer 11 may have a thickness within the range of 500 to 2000 Å.

In the embodiments of the present disclosure, the thickness of the p-Si active layer 11, i.e., the second a-Si layer 122 or the second a-Si film, may be within the range of 500 to 2000 Å. In this regard, during the conversion of the second a-Si layer 122 or the second a-Si film into the p-Si film 123 or the p-Si film, it is able to reduce the power consumption due to the large thickness of the second a-Si layer 122 or the second a-Si film, thereby to simplify the manufacture process and remarkably reduce the manufacture cost. In other words, in the case that the second a-Si layer 122 or the second a-Si film has a thickness within the range of 500 to 2000 Å, it is able to acquire the p-Si layer by subjecting the p-Si film 123 or the p-Si film to crystallization using an existing device.

Based on the above, in the case that the first a-Si layer 12 has a thickness within the range of 500 to 2000 Å, it is able to, on one hand, fuse a part of the first a-Si layer 12 during the crystallization and ensure the acquisition of the large grains as well as the crystallization uniformity, and on the other hand, prevent the waste of materials and reduce the manufacture cost.

The present disclosure provides in some embodiments a method for manufacturing the array substrate, including the above-mentioned method for manufacturing the TFT.

The array substrate may be applied for an LCD. In this case, as shown in FIG. 6, the array substrate may further include the pixel electrode 30 electrically connected to the drain electrode 17. In addition, the array substrate may further include a common electrode.

The array substrate may also be applied to an OLED display device. In this case, as shown in FIG. 7, the array substrate may further include the anode 40 electrically connected to the drain electrode 17, and the organic material function layer 50 and the cathode 60 arranged above the anode 40.

The above are merely the preferred embodiments of the present disclosure, but the present disclosure is not limited thereto. Obviously, a person skilled in the art may make further modifications and improvements without departing from the spirit of the present disclosure, and these modifications and improvements shall also fall within the scope of the present disclosure. Therefore, the protection scope of the present disclosure should be based on the protection scope of the claims

What is claimed is:

1. A thin film transistor (TFT), comprising a substrate, a poly-silicon (p-Si) active layer arranged on the substrate, a first amorphous silicon (a-Si) layer arranged on a surface of the p-Si active layer at a side adjacent to the substrate, and a buffer layer arranged on a surface of the substrate at a side adjacent to the first a-Si layer, wherein an orthogonal projection of the p-Si active layer onto the substrate at least partially overlaps an orthogonal projection of the first a-Si layer onto the substrate, a groove is formed in the buffer layer, and the first a-Si layer is arranged in the groove.

2. The TFT according to claim 1, wherein the first a-Si layer has a thickness within the range of 500 to 2000 Å, and the p-Si active layer has a thickness within the range of 500 to 2000 Å.

3. The TFT according to claim 1, further comprising a gate insulation layer, a gate electrode, an inter-layer insulation layer, a source electrode and a drain electrode arranged sequentially on the p-Si active layer away from the substrate, wherein the source electrode and the drain electrode are in contact with the p-Si active layer through via-holes in the inter-layer insulation layer and the gate insulation layer.

4. The ITT according to claim 3, wherein the gate insulation layer is made of a material identical to the inter-layer insulation layer.

5. The TFT according to claim 1, wherein the orthogonal projection of the p-Si active onto the substrate completely overlaps the orthogonal projection of the first a-Si layer onto the substrate.

6. An array substrate, comprising the thin film transistor (TFT) according to claim 1.

7. The array substrate according to claim 6, further comprising a pixel electrode electrically connected to a drain electrode of the TFT.

8. The array substrate according to claim 7, further comprising a common electrode arranged at a layer identical to, and spaced apart from, the pixel electrode, wherein each of the pixel electrode and the common electrode is a strip-like electrode.

9. The array substrate according to claim 7, further comprising a common electrode arranged at a layer different from the pixel electrode, wherein an upper one of the pixel electrode and the common electrode is a strip-like electrode, and a lower one of the pixel electrode and the common electrode is a plate-like electrode.

10. The array substrate according to claim 6, further comprising a color filter layer.

11. A method for manufacturing a thin film transistor (TFT), comprising a step of forming a poly-silicon (p-Si) active layer on a substrate through crystallization, wherein prior to the step of forming the p-Si active layer, the method further comprises forming a first amorphous silicon (a-Si) layer in contact with the p-Si active layer, wherein an orthogonal projection of the p-Si active layer onto the substrate at least partially overlaps an orthogonal projection of the first a-Si layer onto the substrate; and the method further comprises forming a buffer layer on a surface of the substrate at a side adjacent to the first a-Si layer, wherein a groove is formed in the buffer layer, and the first a-Si layer is arranged in the groove.

12. The method according to claim 11, wherein the step of forming the buffer layer and the first a-Si layer comprises:

forming a buffer layer film on the substrate and forming a first photoresist layer on the buffer layer film;

exposing and developing the first photoresist layer with a first mask plate to expose a portion of the buffer layer film corresponding to the p-Si active layer;

etching the buffer layer film through an etching process, to form the buffer layer with the groove;

removing the remaining portion of the first photoresist layer;

forming a first a-Si film on the buffer layer and forming a second photoresist layer on the first a-Si film;

exposing and developing the second photoresist layer with a second mask plate, to maintain a portion of the second photoresist layer above the groove;

etching the first a-Si film and the buffer layer through an etching process, until an upper surface of the first a-Si layer in the groove is flush with a surface of the buffer layer at a position other than a position where the groove is formed; and removing the remaining portion of the second photoresist layer.

13. The method according to claim 12, wherein the first mask plate is identical to the second mask plate, and the first photoresist layer is made of a positive photoresist and the second photoresist layer is made of a negative photoresist, or the first photoresist layer is made of a negative photoresist and the second photoresist layer is made of a positive photoresist.

14. The method according to claim 12, wherein the step of forming the p-Si active layer comprises:

forming a second film on the substrate with the first a-Si layer;

subjecting the second a-Si film to crystallization, to form a p-Si film;

forming a third photoresist layer on the p-Si film, and exposing and developing the third photoresist layer with the second mask plate;

etching the p-Si film through an etching process to form the p-Si active layer; and removing the remaining portion of the third photoresist layer, or the step of forming the p-Si active layer comprises:

forming a second a-Si film on the substrate with the first a-Si layer;

forming a third photoresist layer on the second a-Si film;

exposing and developing the third photoresist layer with the second mask plate;

etching the second a-Si film through an etching process to form a second a-Si layer;

removing the remaining portion of the third photoresist layer; and subjecting the second a-Si layer to crystallization, to form the p-Si active layer.

15. The method according to claim 12, wherein the etching process is a dry-etching process.

16. The method according to claim 11, wherein the first a-Si layer has a thickness within the range of 500 to 2000 Å, and the p-Si active layer has a thickness within the range of 500 to 2000 Å.

17. The method according to claim 11, wherein the orthogonal projection of the p-Si active layer onto the substrate completely overlaps the orthogonal projection of the first a-Si layer onto the substrate.

18. A method for manufacturing an array substrate, comprising the method according to claim 11.

* * * * *